(12) United States Patent
Beall et al.

(10) Patent No.: US 7,453,707 B2
(45) Date of Patent: Nov. 18, 2008

(54) TOOL-LESS, TRANSLATING HARD DRIVE BAY

(75) Inventors: Christopher S. Beall, Seattle, WA (US);
Edmond Bailey, Cedar Park, TX (US);
Alex Z. Rodriguez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 371 days.

(21) Appl. No.: 11/192,148

(22) Filed: Jul. 28, 2005

(65) Prior Publication Data

US 2007/0025095 A1 Feb. 1, 2007

(51) Int. Cl.
*H05K 7/14* (2006.01)
(52) U.S. Cl. .................. 361/796; 361/752; 361/729; 361/730; 211/41.17
(58) Field of Classification Search .................. 361/683, 361/788, 796, 752, 730, 728, 679; 174/520, 174/50; 211/41.17
See application file for complete search history.

(56) References Cited

U.S. PATENT DOCUMENTS

| 5,406,453 | A | | 4/1995 | Cusato et al. |
| 5,808,876 | A | * | 9/1998 | Mullenbach et al. ........ 361/788 |
| 5,963,431 | A | * | 10/1999 | Stancil ........................ 361/803 |
| 5,995,376 | A | * | 11/1999 | Schultz et al. ............... 361/788 |
| 6,347,963 | B1 | * | 2/2002 | Falkenberg et al. ......... 439/638 |
| 6,643,141 | B2 | * | 11/2003 | Kaetsu et al. ................ 361/797 |
| 6,839,233 | B2 | | 1/2005 | Cravens et al. |
| 6,847,528 | B2 | * | 1/2005 | Sucharczuk et al. ......... 361/796 |
| 6,906,914 | B2 | * | 6/2005 | Stamos et al. ................ 361/683 |
| 7,177,145 | B2 | * | 2/2007 | Carlson et al. .............. 361/685 |

* cited by examiner

*Primary Examiner*—Dean A. Reichard
*Assistant Examiner*—Dameon E Levi
(74) *Attorney, Agent, or Firm*—Haynes and Boone, LLP (57) ABSTRACT

A method and system for housing electronic components includes a chassis having a first sub-chassis slidably dockable into a first end of the chassis. The first sub-chassis houses a first set of electronic components and includes a backplane to electrically couple the first set of electronic components to a second set of electronic components located adjacent to the first sub-chassis. The second set of electronic components is housed in a second sub-chassis, which is accessible via a second end of the chassis. The backplane is accessible by slidably undocking the first sub-chassis without removal of any one of the second set of electronic components. Some of the second set of electronic components are accessible by slidably undocking the first sub-chassis and without removal of the backplane.

20 Claims, 6 Drawing Sheets

TOOL-LESS, TRANSLATING HARD DRIVE BAY

BACKGROUND

The present disclosure relates generally to information handling systems, and more particularly to a chassis for housing components of an information handling system components such as printed circuit boards, peripherals, power supplies and connectors.

As the value and use of information continues to increase, individuals and businesses seek additional ways to acquire, process and store information. One option available to users is information handling systems. An information handling system ('IHS') generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Figure 1:
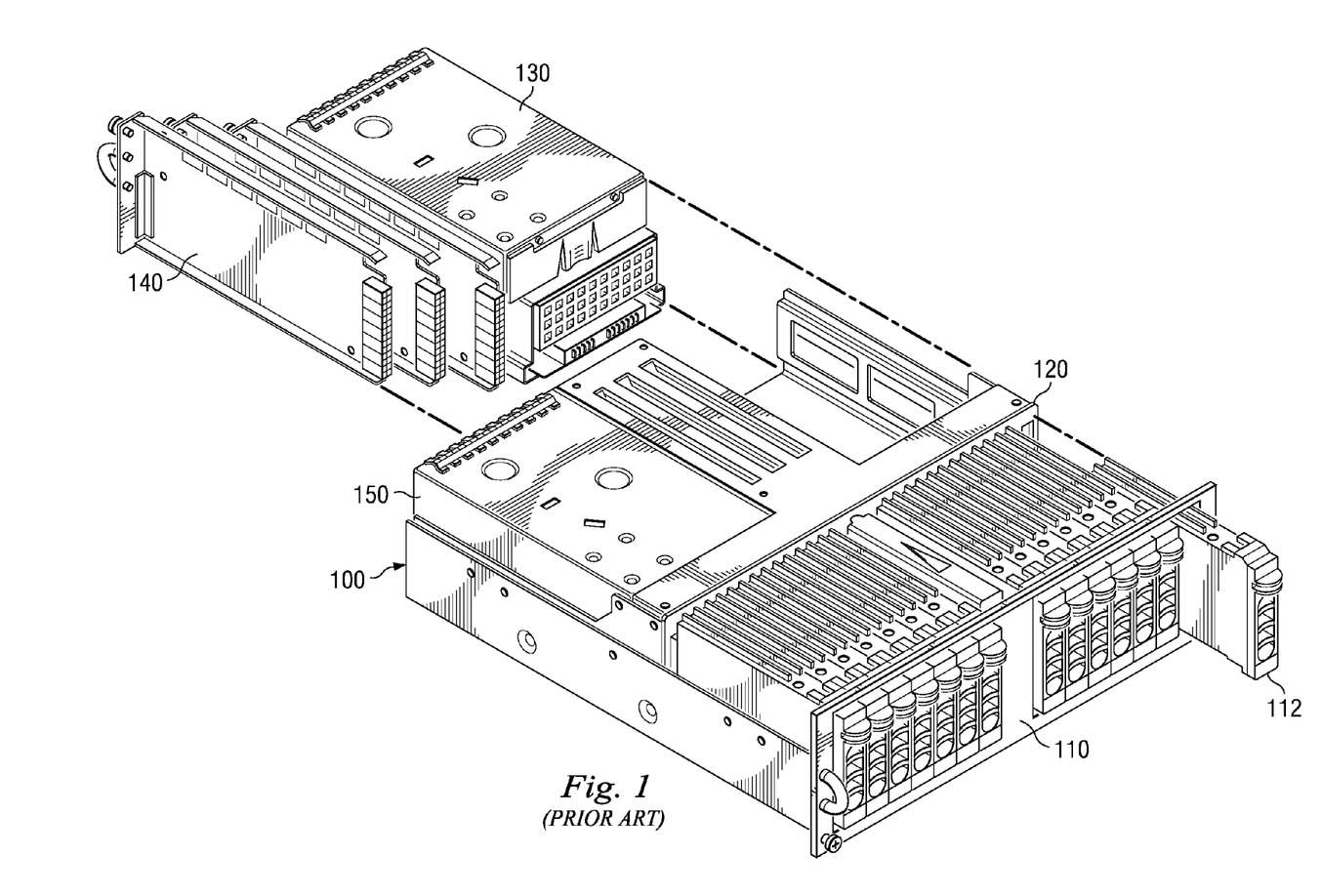
FIG. 1 illustrates a view in perspective of a computer chassis, described herein above, according to prior art.

FIG. 1, is a view in perspective of a computer chassis, according to prior art. A chassis 100 typically houses the main electronic components of the computer system, including a motherboard (also referred to as a planar module), power supply, cooling system, and optional cards, such as interface boards that provide audio, video and/or networking capabilities. In addition to housing and protecting the electrical and mechanical components, the chassis 100 also provides a mounting structure for the electronic components that are secured in accordance with a layout that efficiently interconnects them. The structure often incorporates hooks, tabs, channels, slots, screws, or the like for mounting circuit boards within the chassis. These mounting techniques often result in a reduction of useful surface area of the circuit board, especially the planar module.

The layout of the chassis 100 typically includes providing accessibility to computer components, boards, assemblies and/or modules from the front and the back of the chassis. These components are typically connected, directly or indirectly, to the planar module (not shown), which is typically mounted in the back of the chassis. Most chassis layouts provide a front access to user accessible peripheral devices 110, such as removable hard disk drives (HDD) 112, optical disk drives, and/or universal serial bus (USB) ports. These front accessible peripheral devices 110 typically include a backplane 120, which is typically located centrally sandwiched in-between the front accessible peripheral devices 110 and rear mounted assemblies 130, 140 and 150. As is well known, the backplane 120 facilitates the electrical coupling between the front and back mounted electronic assemblies and typically includes a printed circuit board assembly.

Presently, some modular designs of the chassis 100 enable docking or undocking of some rear mounted functional assemblies 130, 140 and 150 which may include a fan/blower assembly, rear accessible circuit modules, peripheral component interconnect (PCI) input/output (I/O) riser assembly, power supplies and similar others.

Accessibility to the backplane 120 for servicing and/or replacing may be difficult. Accessing the backplane 120 for service and/or replacement may require removal of the modular components such as the fan assembly, the PCI input/output (I/O) riser assembly and removal of bulky power supply units, which may be blocking user's access to the backplane 120. In some cases, removal of the planar module may also be required. Often special tools may have to be used to gain access to these centrally located components within the chassis enclosure. Thus, servicing and replacement of the backplane 120, as well as its initial factory assembly has been difficult and has often consumed excessive time.

Therefore, a need exists to provide a tool-less method and system for efficiently servicing centrally located components within a chassis of a computer system. Additionally, a need exists to service and/or replace a backplane assembly of a computer system preferably without removal of any additional electronic components within the computer system. Accordingly, it would be desirable to provide a tool-less method and system for accessing centrally located components within a chassis of an information handling system absent the disadvantages found in the prior methods discussed above.

SUMMARY

The foregoing need is addressed by the teachings of the present disclosure, which relates to a system and method for housing electronic components within a chassis. According to one embodiment for housing electronic components, a chassis includes a first sub-chassis slidably dockable into a first end of the chassis. The first sub-chassis houses a first set of electronic components and includes a backplane to electrically couple the first set of electronic components to a second set of electronic components located adjacent to the first sub-chassis. The second set of electronic components is housed in a second sub-chassis, which is accessible via a second end of the chassis. The backplane is accessible by slidably undocking the first sub-chassis without removal of any one of the second set of electronic components.

Several advantages are achieved by the method and system according to the illustrative embodiments presented herein. The embodiments advantageously provide for an improved modular design to house electronic components within a chassis. Various centrally located electronic components within the chassis such as the backplane are accessible by simply sliding out a modular portion of the chassis. The technique to slidably dock and undock the first sub-chassis for easier servicing of the backplane, also conserves space within the chassis. In addition, some components of the the second set of electronic components are accessible without removal of the backplane. Thus, accessibility to these centrally located components within the chassis is provided without having to use tools and/or having to remove any additional electronic components.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, and/or components described herein may be implemented as hardware (including discrete components, integrated circuits and systems-on-a-chip 'SOC'), firmware (including application specific integrated circuits and programmable chips) and/or software or a combination thereof, depending on the application requirements.

A device includes any machine or component, which is electrically coupled to an IHS to perform at least one pre-defined function. Examples of devices include power supplies, fan assemblies, chargers, controllers, disk drives, scanners, printers, card readers, keyboards, and communication interfaces. Many devices may require a software program called a device driver program that acts as a translator between an application program and the device, or between a user and the device.

Chassis designs and layout structures for housing electronic components are available in a variety of dimensions and form-factors. Most chassis layouts provide a front and rear access to service electronic components. However, servicing electronic components such as a backplane assembly, which may be located centrally within the chassis, is often difficult and time consuming. For example, accessing the backplane may require tool-assisted removal of one or more electronic components. There is a need for an efficient chassis structure to house electronic components, especially for accessing electronic components located centrally within the chassis.

According to one embodiment, in a method and system for housing electronic components include a chassis having a first sub-chassis slidably dockable into a first end of the chassis. The first sub-chassis houses a first set of electronic components and includes a backplane to electrically couple the first set of electronic components to a second set of electronic components located adjacent to the first sub-chassis. The second set of electronic components is housed in a second sub-chassis, which is accessible via a second end of the chassis. The backplane is accessible by slidably undocking the first sub-chassis without removal of any one of the second set of electronic components. Some of the second set of electronic components are accessible by slidably undocking the first sub-chassis and without removal of the backplane.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price. The information handling system may include random access memory (RAM), one or more processing resources such as central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 2:
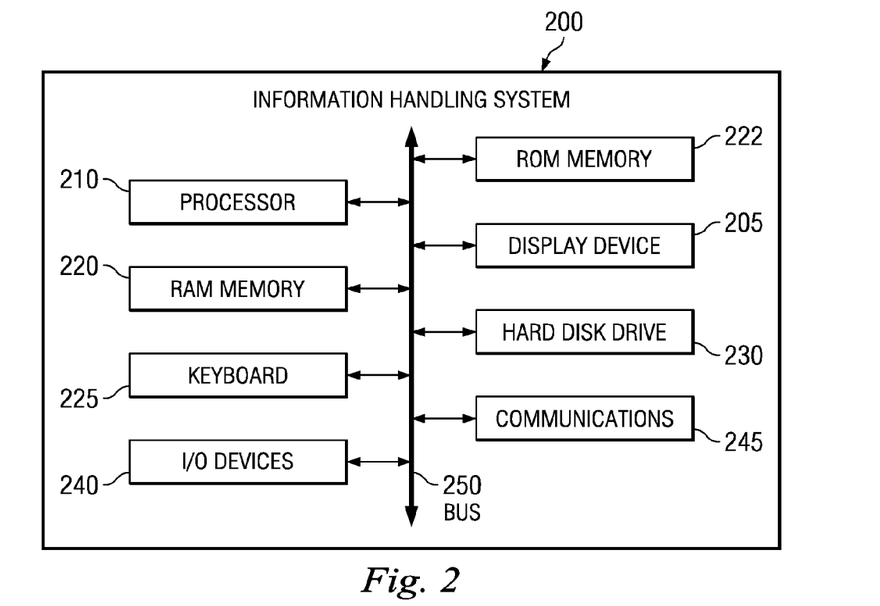
FIG. 2 illustrates a block diagram of an information handling system having an improved chassis, according to an embodiment.

FIG. 2 illustrates a block diagram of an information handling system 200 having an improved chassis, according to an embodiment. The information handling system 200 having an improved chassis (not shown) includes a processor 210, a system random access memory (RAM) 220 (also referred to as main memory), a non-volatile ROM 222 memory, a display device 205, a keyboard 225 and an I/O controller 240 for controlling various other input/output devices. For example, the I/O controller 240 may include a keyboard controller, a memory storage drive controller and/or the serial I/O controller. It should be understood that the term "information handling system" is intended to encompass any device having a processor that executes instructions from a memory medium.

The IHS 200 is shown to include a hard disk drive 230 connected to the processor 210 although some embodiments may not include the hard disk drive 230. The processor 210 communicates with the system components via a bus 250, which includes data, address and control lines. In one embodiment, the IHS 200 may include multiple instances of the bus 250. A communications controller 245, such as a network interface card, may be connected to the bus 250 to enable information exchange between the IHS 200 and other devices (not shown). In an exemplary, non-depicted embodiment, one or more electronic components of the IHS 200 such as the processor 210, RAM memory 220, ROM memory 222, and the I/O controller 240 may be mounted on a motherboard, also referred to as a planar module.

In an exemplary, non-depicted embodiment, additional components of the IHS 200 including electromechanical components may include pluggable hard disk drives, removable magnetic or optical media storage drives, one or more fan assemblies, cooling ducts and vents, power supplies, and one or more connectors to facilitate inter-device electrical coupling. The IHS 200 may also include a bus riser component such as the PCI input/output (I/O) riser assembly to increase the number of devices coupled to the PCI bus.

The processor 210 is operable to execute the computing instructions and/or operations of the IHS 200. The memory medium, e.g., RAM 220, preferably stores instructions (also known as a "software program") for implementing various embodiments of a method in accordance with the present disclosure. In various embodiments the instructions and/or software programs may be implemented in various ways, including procedure-based techniques, component-based techniques, and/or object-oriented techniques, among others. Specific examples include assembler, C, XML, C++ objects, Java and Microsoft Foundation Classes (MFC).

Figure 3A:
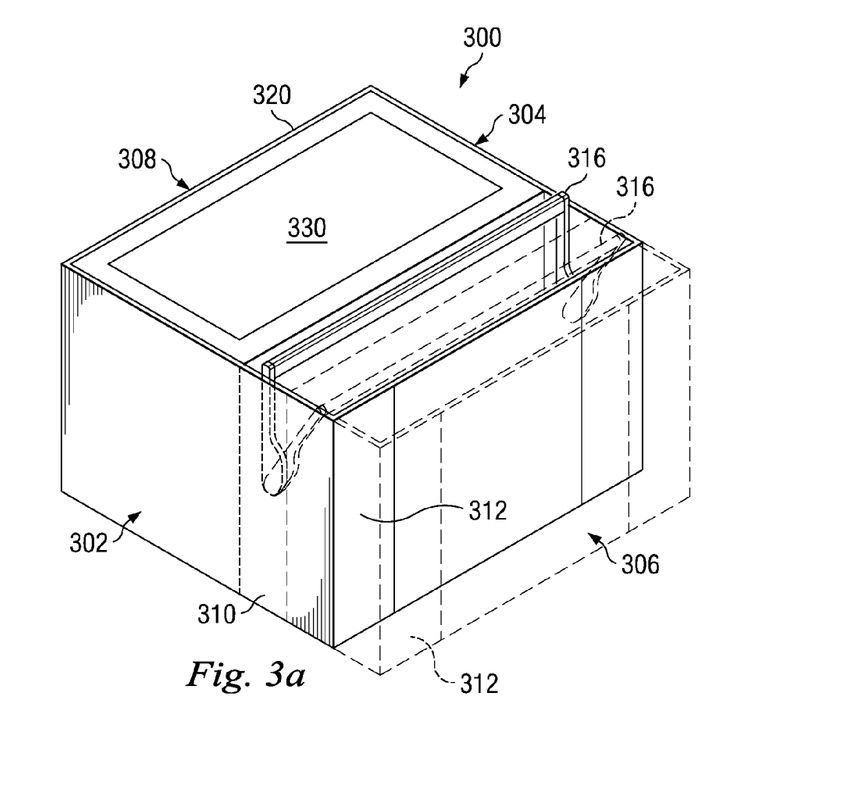
FIG. 3A illustrates a view in perspective of a chassis for housing electronic components, according to an embodiment.

FIG. 3A illustrates a view in perspective of a chassis 300 for housing electronic components, according to an embodiment. In the depicted embodiment, the chassis 300 is in the shape of a three dimensional rectangular box frame having a base and a removable top, removable opposite sides (a left side 302 and a right side 304) and opposite ends (a first end 306 and a second end 308). The chassis 300 may be suitable for mounting in a cabinet, e.g., rack mountable, or may be suitable as a standalone, free standing enclosure. The chassis 300 is typically fabricated from a sheet metal, thereby protecting the electronic components housed within from physical damage and/or electromagnetic interference (EMI). Depending on the size and number of electronic components housed within, the weight of the chassis 300 may vary between a few pounds to several tens of pounds.

In an exemplary, non-depicted embodiment, the particular dimensions for the chassis 300 may vary depending on the number of components housed within. For rack mounted computer systems, there is standardization of chassis size and cabinet size. The capacity of racks mounted within a rack cabinet is often measured in height by the number of 'U's, where each 'U' is generally equivalent to 1.75 inches. The standard internal height for a tall rack cabinet is typically 42U or 73.5 inches and for a short rack cabinet it is typically 24U or 42.0 inches in height. Most chassis are mounted on rails spaced 19 inches apart within the cabinet. A family of server computers typically includes a plurality of compatible computer systems ranging from a low end price/performance system to a high end price/performance system. Dimensions of the family of servers may vary from 1 U upwards, depending on the functionality and performance of the server.

In the depicted embodiment, the chassis 300 includes a first sub-chassis 310 that is slidably (e.g., by sliding) dockable into the first end 306, which may also be referred to as the front end of the chassis 300. As described herein, a sub-chassis is at least a portion of the chassis 300. In a particular embodiment, the first sub-chassis 310 has dimensions that are slightly smaller than the inside dimensions of the chassis 300 to facilitate sliding or translating of the first sub-chassis 310 into the first end 306.

A cam lever assembly 316 is rotatably secured to a pivotal point at an inside surface of the chassis 300. The cam level assembly 316 is rotatable in the shape of an arc to activate a docking mechanism, which facilitates the sliding in, positioning and latching of the first sub-chassis 310 to the chassis 300. The first sub-assembly 310 may be described to be docked or be in a latched position when the entire first sub-assembly 310 is securely housed substantially within the chassis 300. In an exemplary, non-depicted embodiment, the first sub-chassis 310 may include a face plate bezel having dimension greater than those of the chassis 300. In this embodiment, the face plate bezel is outside the chassis 300 when the first sub-chassis 310 is in a docked position. Similarly, the cam lever assembly 316 is operable to activate an undocking mechanism, which facilitates the unlatching, positioning and sliding out of the first sub-chassis 310 from the chassis 300. The first sub-assembly 310 may be described to be partially or fully undocked or be in an unsecured position (as indicated by dotted lines) when at least a portion of the first sub-assembly 310 is not housed within the chassis 300. In a particular embodiment, the first sub-chassis 310 may be completely slid out of the chassis 300. In an exemplary non-depicted embodiment, a stop mechanism may be provided for safety reasons to prevent a user from completely sliding out the first sub-chassis 310 from the chassis 300. Additional detail of the cam lever assembly 316 is described with reference to FIG. 3E.

The first sub-chassis 310 houses a first set of electronic components 312. The length of the first sub-chassis 310 may vary depending on the size and form factor of the first set of electronic components 312. In a particular embodiment, the chassis 300 houses one or more components including electromechanical components of the IHS 200. The first set of electronic components 312 is configured to include one or more user accessible peripheral devices. Examples of front end, user accessible peripheral devices include a pluggable hard disk drive (HDD), a magnetic or optical disk drive with removable media, a control panel for interfacing with the user, a communication bus port and similar others. The first set of electronic components 312 may also include electromechanical components such as flip switches and selector dials.

A second sub-chassis 320 houses a second set of electronic components 330, which may also include electromechanical components. The second set of electronic components are accessible via the second end 308 of the chassis 300.

Figure 3B:
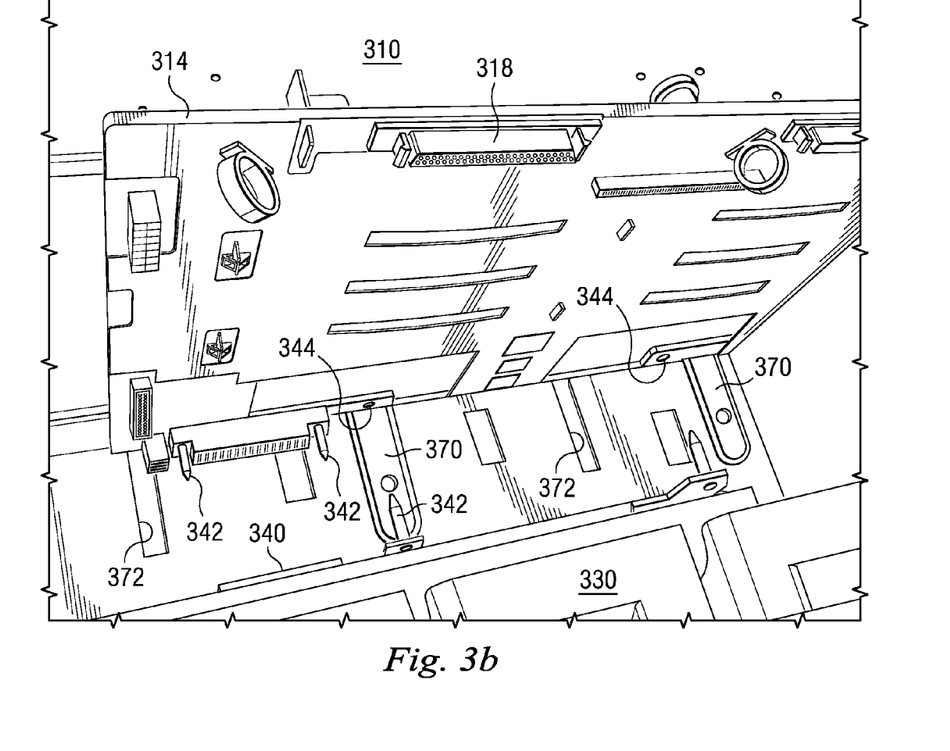
FIG. 3B illustrates a view in perspective of a backplane of a first sub-chassis of FIG. 3A, according to an embodiment.

FIG. 3B illustrates a view in perspective of a backplane of a first sub-chassis of FIG. 3A, according to an embodiment. In a particular embodiment, the first sub-chassis 310 includes a backplane 314 to electrically couple the first set of electronic components 312 (not shown) to a second set of electronic components 330 located adjacent to the first sub-chassis 310. The second set of electronic components 330, which may also include electromechanical components, is housed in a second sub-chassis 320 (not shown) accessible via the second end 308 of the chassis 300.

In a particular embodiment, the chassis 300 is divided into the first sub-chassis 310 and the second sub-chassis 320 by a separating member 340, which is removably secured to the base portion of the chassis 300 and oriented substantially parallel to the backplane 314. In an exemplary non-depicted embodiment, the separating member 340 may include a plurality of alignment pins 342 to mate with corresponding alignment pin holes 344 when the first sub-chassis 310 is docked into the first end 306 of the chassis 300. In a particular embodiment, the separating member 340 provides a common ground shared between the first sub-chassis 310 and the second sub-chassis 320 when the first sub-chassis 310 is docked into the first end 306 of the chassis 300. In one embodiment, the first set of electronic components 312 may be directly coupled to the second set of electronic components 330 via cables and connectors without being coupled through the separating member 340.

In one embodiment, the backplane 314 is a printed circuit board assembly that is removably mounted on the back end of the first sub-chassis 310. Thus, the backplane 314 moves as the first sub-chassis 310 moves. The backplane 314 is oriented substantially perpendicular to the top and bottom portion of the chassis 300 and is substantially parallel to the front end and back end of the chassis 300. The backplane 314 includes a plurality of connectors 318 to enable the electrical coupling between the first and second set of electronic components 312 and 330. A plurality of friction reducing strips 370, which may be removably coupled to an inside surface of the base of the chassis 300, are positioned inbetween the first sub-chassis 310 and the chassis 300 to reduce sliding friction. A plurality of channel guides 372 with matching sub-chassis base support members (not shown), which are located on inside base surface of the chassis 300 and the outside bottom surface of the first sub-chassis 310 respectively, facilitate the alignment, positioning and sliding of the first sub-chassis 310 into the chassis 300.

Figure 3C:
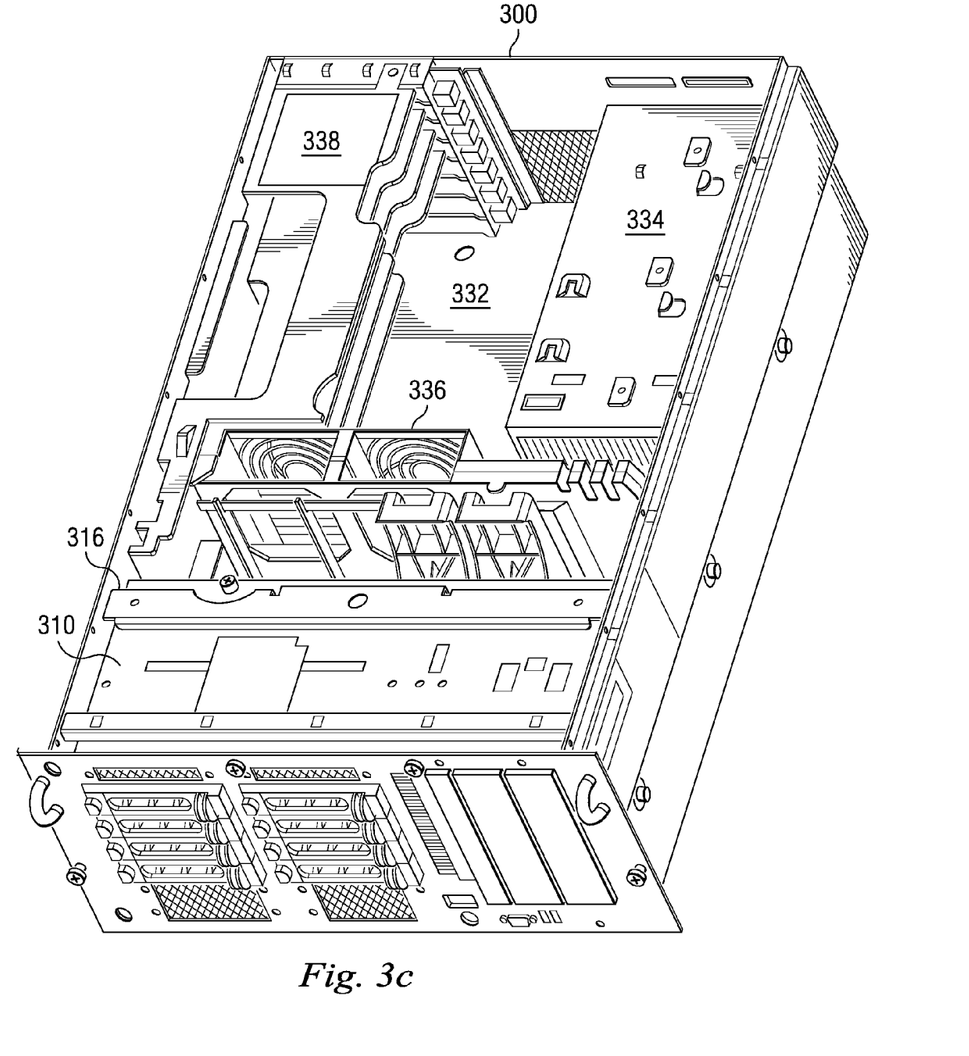
FIG. 3C illustrates a view in perspective of a chassis in a docked position, according to an embodiment.
Figure 3D:
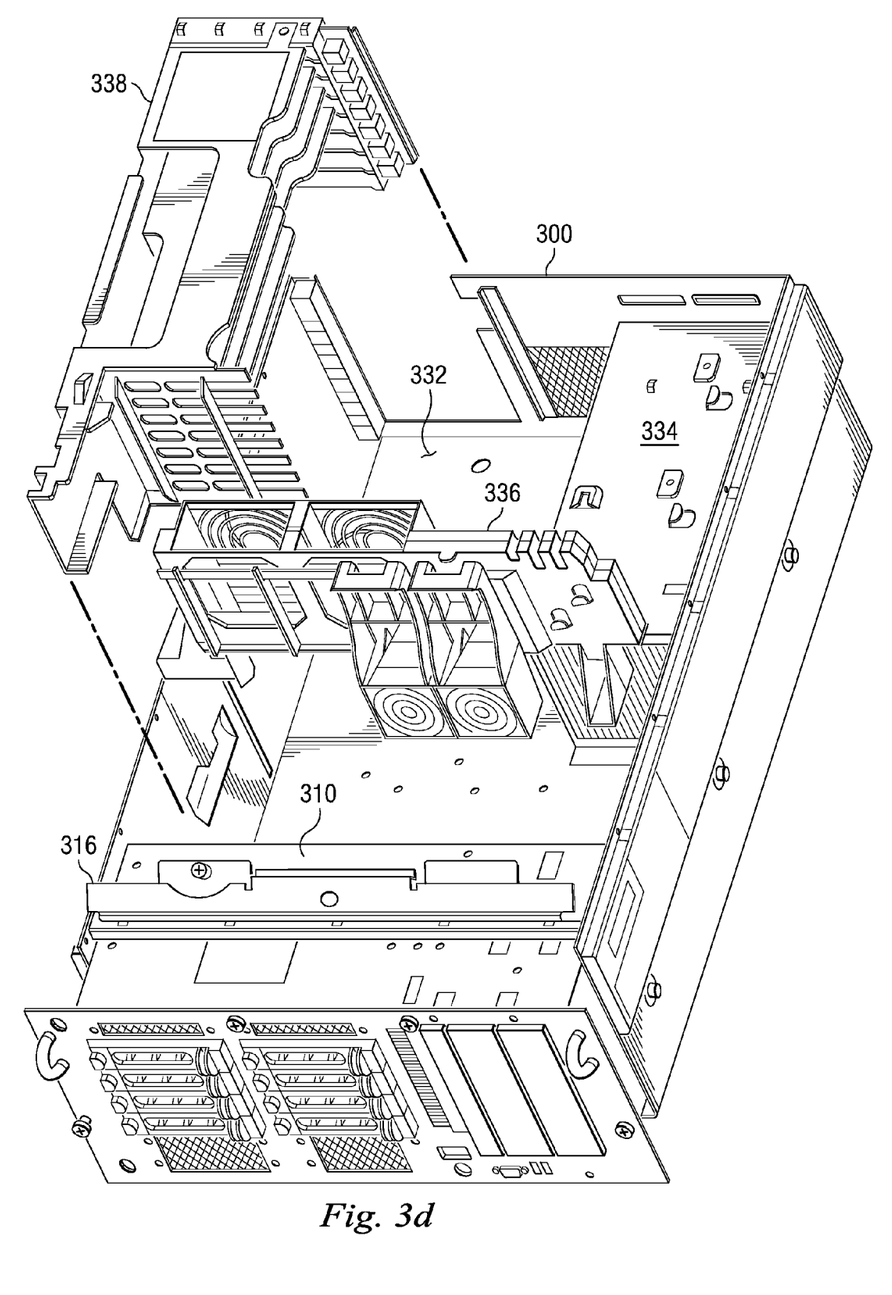
FIG. 3D illustrate a view in perspective of a chassis in an undocked position, according to an embodiment.

FIGS. 3C and 3D illustrate a view in perspective of an assembled chassis (in a docked position) and an unassembled chassis (in an undocked position), according to an embodiment. Referring to FIGS. 3B, 3C and 3D, in one embodiment, the activation of the docking mechanism by operating the cam lever assembly 316 results in automatically aligning and mating of male/female connectors 318 located on the backplane 314 with the corresponding female/male connectors located on the separating member 340 and/or female/male connectors located on the second set of the electronic components 330. The docking mechanism thus enables electrical coupling between the first and second set of electronic components 312 and 330. Similarly, activation of the undocking mechanism by operating the cam lever assembly 316 results in automatically disconnecting the male/female connectors 318 located on the backplane 314 with the corresponding female/male connectors located on the separating member 340 and/or female/male connectors located on the second set of the electronic components 330. The undocking mechanism thus enables electrical decoupling between the first and second set of electronic components 312 and 330.

When the first sub-chassis 310 is in a docked position, the backplane 314 may be accessed by removal of one or more components of the second set of electronic components 330. When the first sub-chassis 310 is in an undocked and slid out position, the backplane 314 is exposed and it is tool-lessly accessible without having to remove additional electronic components. That is, the backplane 314 is accessible by simply slidably undocking the first sub-chassis 310 without removal of any one of the second set of electronic components 330 and without using a tool. In a particular embodiment, the docking and undocking mechanism may not automatically couple and decouple the first set of electronic components 312 from the second set of the electronic components 330 when they are directly and/or manually coupled via a cable.

In the depicted embodiment, the second set of electronic components 330 include a planar module 332 (shown covered by a protective cover/shield), a power supply 334, a fan assembly 336 and a peripheral component interconnect (PCI) input/output riser assembly 338. The planar module 332 may be used to mount at least a portion of the components of the IHS 200 such as the processor 210, the RAM memory 220, the ROM memory 222, and the I/O controller 240. The planar module 332 is securely coupled to the base of the chassis 330 by fastening means such as screws. Other component assemblies such as the power supply 334, the fan assembly 336 and the peripheral component interconnect (PCI) input/output riser assembly 338 are coupled to the planar module 332 via connectors. As described above, the undocked position of the first sub-chassis 310 enables easier access to backplane 314. In addition, the undocking also enables easier access to the second set of electronic components 330 without removal of any other components. That is, some of the second set of electronic components 330 may also be easily accessible in the undocked position of the first sub-chassis 310 without removal of the backplane 314. For example, the planar module 332 and/or other centrally located components may be accessible simply by sliding and undocking and without having to remove the backplane 314. The use of a compact mechanism, e.g., slidably undocking the first sub-chassis 310 to enable access to centrally located components, contributes to an increase in the available/useful area within the chassis, especially around the planar module 332.

Figure 3E:
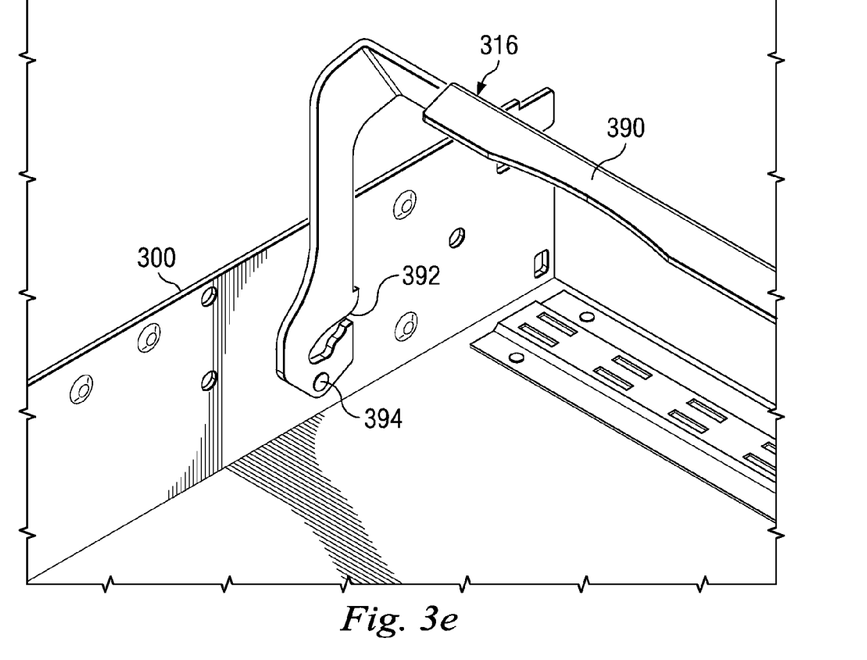
FIG. 3E illustrates a view in perspective of a portion of a cam lever assembly of FIG. 3A, according to an embodiment.

FIG. 3E illustrates a view in perspective of a portion of a cam lever assembly, according to an embodiment. The cam lever assembly 316 includes a center arm portion 390 rigidly coupled at right angles to two end arm portions that are substantially parallel to each other, the ends of which are rotatably secured to pivot point 394 on an inside surface of the left 302 and right 304 sides of the chassis 300. The height of the cam lever assembly 316 provides sufficient clearance to the first sub-assembly 310 to slide under. This enables the cam lever assembly 316 to rotate about the pivot point 394 between an undocked position and a docked position. In the undocked position a latch having a slot or an opening 392 is aligned and positioned to receive a matching latch member (not shown) such as a protruding pin secured to an outside surface of the first sub-chassis. When the first sub-chassis 310 is slid into the first end 306 of the chassis 300 the matching latch member passes through the opening 392. When the cam lever assembly 316 is rotated counterclockwise the first sub-chassis 310 slides into the chassis 300 and is thereby docked in a secure & latched manner. A locking mechanism (not shown) may be provided to hold the docking position and prevent accidental movement of the cam lever assembly 316. To undock the locking mechanism may be released (if present) and the cam lever assembly 316 rotated clockwise to enable sliding out of the first sub-chassis 310. In the undocked position, the protruding pin is aligned with the opening 392, thereby allowing the first sub-chassis 310 to be slid out further. As described earlier, a stop mechanism may be provided to prevent a user from completely sliding out the first sub-chassis 310 from the chassis 300.

Figure 4:
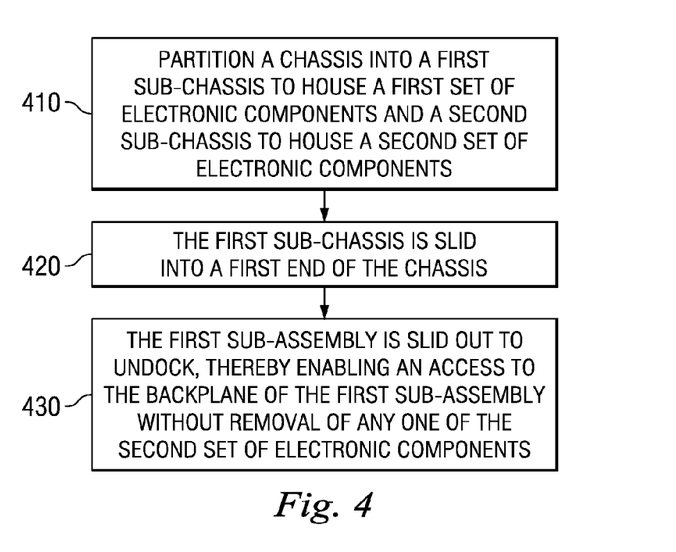
FIG. 4 is a flow chart illustrating a method for housing electronic components, according to an embodiment.

FIG. 4 is a flow chart illustrating a method for housing electronic components in a chassis, according to an embodiment. In step 410, a chassis is partitioning into a first sub-chassis to house a first set of electronic components and a second sub-chassis to house a second set of electronic components. In step 420, the first sub-chassis is slid into a first end of the chassis to dock. The docking causes a backplane of the first sub-chassis to electrically couple the first set of electronic components to the second set of electronic components. In step 430, the first sub-assembly is slid out to undock. The undocking enables an access to the backplane without removal of any one of the second set of electronic components and without use of a tool. Various steps described above may be added, omitted, combined, altered, or performed in different orders. For example an additional step (not shown) may be performed after step 430 to manually disconnect any cables that may be used to electrically couple the first set of electronic components to the second set of electronic components.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, it should be understood that while the docking mechanism is implemented using a cam lever assembly, it would be within the spirit and scope of the invention to encompass an embodiment using an alternative docking means.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic component housing comprising:
   a first sub-chassis slidably mounted for movement in a first end of a chassis, wherein the first sub-chassis houses a first set of electronic components, the first sub-chassis including a backplane as a portion thereof to electrically couple the first set of electronic components to a second set of electronic components located adjacent to the first sub-chassis, the backplane portion of the first sub-chassis thus moving in response to movement of the first sub-chassis; and
   a second sub-chassis housing the second set of electronic components accessible via a second end opposite to the first end of the chassis, wherein the backplane is accessible by moving in response to slidably removing the first sub-chassis without removal of any one of the second set of electronic components.

2. The housing of claim 1, wherein the backplane is accessible without using a tool.

3. The housing of claim 1, wherein the first set of electronic components includes at least one user accessible peripheral device.

4. The housing of claim 3, wherein the user accessible peripheral device is one of a pluggable hard disk drive (HDD), an optical disk drive, a control panel, and a communication bus port.

5. The housing of claim 1, wherein the removal results in electrically decoupling the first set of electronic components from the second set of electronic components.

6. The housing of claim 1, wherein the second set of electronic components includes at least one of a planar module, a power supply, a fan assembly and a peripheral component interconnect (PCI) input/output riser assembly.

7. The housing of claim 1, wherein the first sub-chassis is mounted by sliding into the first end of the chassis and by operating a cam lever to dock the first sub-chassis into the first end of the chassis.

8. The housing of claim 7, wherein the removal is performed by releasing the cam lever to undock the first sub-chassis from the chassis and slidably removing the first sub-chassis.

9. The housing of claim 1, wherein the first sub-chassis is separated from the second sub-chassis by a separating member removably secured to the chassis.

10. The housing of claim 9, wherein the first sub-chassis and the separating member each include a plurality of alignment pins to mate with corresponding alignment pin holes when the first sub-chassis is docked into the first end of the chassis.

11. The housing of claim 9, wherein the separating member provides a common ground shared between the first sub-chassis and the second sub-chassis when the first sub-chassis is mounted into the first end of the chassis.

12. The housing of claim 1, wherein the first sub-chassis slides on a plurality of friction reducing strips removably coupled to the chassis.

13. A method for housing electronic components in a chassis, the method comprising:
   partitioning the chassis into a movable first sub-chassis to house a first set of electronic components and a second sub-chassis to house a second set of electronic components;
   sliding in the first sub-chassis to dock into a first end of the chassis thereby causing a backplane portion of the first sub-chassis, being connected to simultaneously be carried by and move in response to movement of the first sub-chassis, to electrically couple the first set of electronic components to the second set of electronic components; and
   sliding out the first sub-chassis to undock thereby simultaneously moving the backplane portion and enabling an access to the backplane without removal of any one of the second set of electronic components.

14. The method of claim 13, wherein the backplane is accessible without using a tool.

15. The method of claim 13, wherein the sliding out enables access to the second set of electronic components without removal of any one of the first set of electronic components.

16. The method of claim 13, wherein the first set of electronic components includes at least one of a pluggable hard disk drive (HDD), an optical disk drive, a control panel, and a communication bus port.

17. The method of claim 13, wherein the second set of electronic components includes at least one of a planar module, a power supply, a fan assembly and a peripheral component interconnect (PCI) input/output riser assembly.

18. An information handling system (IHS) comprising:
   a processor mounted on a board;
   a peripheral device coupled to the processor;
   a power supply for providing power to the processor and the peripheral device; and
   a chassis for housing the board, the peripheral device and the power supply, wherein the chassis includes:
   a first sub-chassis slidably movable and dockable into a first end of the chassis, wherein the first sub-chassis houses the peripheral device, the first sub-chassis including a backplane as a portion thereof to electrically couple the peripheral device to the board located adjacent to the first sub-chassis, the backplane portion of the first sub-chassis thus moving in response to movement of the first sub-chassis; and
   a second sub-chassis housing the power supply and the board accessible via a second end of the chassis, wherein the backplane is accessible by moving in response to slidably undocking the first sub-chassis without removal of the power supply.

19. The system of claim 18, wherein the backplane is accessible without using a tool.

20. The system of claim 18, wherein the first sub-chassis is separated from the second sub-chassis by a separating member removably secured to the chassis, the separating member providing a common ground shared between the first sub-chassis and the second sub-chassis when the first sub-chassis is docked into the first end of the chassis.

* * * * *